United States Patent
Kang et al.

(10) Patent No.: US 8,368,302 B2
(45) Date of Patent: Feb. 5, 2013

(54) FLAT PANEL DISPLAY DEVICE HAVING REDUCED FRIT DELAMINATION AND METHOD OF FABRICATING THE SAME

(75) Inventors: Tae-Wook Kang, Yongin (KR); Mi-Sook Suh, Yongin (JP); Zail Lhee, Yongin (KR); Hun Kim, Yongin (KR); Seung-Yeon Cho, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 113 days.

(21) Appl. No.: 12/839,646

(22) Filed: Jul. 20, 2010

(65) Prior Publication Data

US 2011/0018430 A1 Jan. 27, 2011

(30) Foreign Application Priority Data

Jul. 21, 2009 (KR) ........................ 10-2009-0066478

(51) Int. Cl.
*H01L 51/52* (2006.01)
(52) U.S. Cl. .......... 313/512; 313/507; 313/508; 445/24; 445/25; 257/88
(58) Field of Classification Search .......... 313/498–512; 315/169.1, 169.3
See application file for complete search history.

(56) References Cited

U.S. PATENT DOCUMENTS

| | | | |
|---|---|---|---|
| 6,111,357 A * | 8/2000 | Fleming et al. | 313/509 |
| 7,047,665 B2 | 5/2006 | Polato | |
| 7,764,012 B2 * | 7/2010 | Yamazaki et al. | 313/503 |
| 2004/0207317 A1 | 10/2004 | Kim | |
| 2007/0114921 A1 * | 5/2007 | Yamazaki et al. | 313/504 |
| 2007/0170857 A1 * | 7/2007 | Choi et al. | 313/512 |
| 2007/0262318 A1 * | 11/2007 | Shoji et al. | 257/72 |
| 2007/0279572 A1 | 12/2007 | Yonemura | |
| 2008/0204619 A1 * | 8/2008 | Saitou et al. | 349/43 |
| 2009/0001884 A1 * | 1/2009 | Nakanishi | 313/505 |
| 2009/0051286 A1 * | 2/2009 | Yamazaki et al. | 313/512 |

FOREIGN PATENT DOCUMENTS

| | | |
|---|---|---|
| CN | 101009956 | 8/2007 |
| JP | 2000-036381 | 2/2000 |
| JP | 2004-319507 | 11/2004 |
| JP | 2007-200840 A | 8/2007 |
| JP | 2007-328027 | 12/2007 |
| KR | 10-2005-0004813 | 1/2005 |
| KR | 10-2007-0010422 | 1/2007 |
| KR | 0703445 B1 | 3/2007 |
| KR | 0703518 B1 | 3/2007 |
| KR | 0712185 B1 | 4/2007 |

* cited by examiner

*Primary Examiner* — Tracie Y Green
(74) *Attorney, Agent, or Firm* — Robert E. Bushnell, Esq.

(57) ABSTRACT

A flat panel display device and a method of fabricating the same, the flat panel display device including: a first substrate including a display portion to display an image and a peripheral portion disposed outside the display portion; a second substrate facing the first substrate; a frit disposed on the peripheral portion, to attach the first substrate to the second substrate; and a signal interconnection having portions overlapping the frit, to transmit a signal to the display portion. Edges of the signal interconnection that are overlapped by the frit are patterned, to prevent delamination of the frit.

20 Claims, 5 Drawing Sheets

FLAT PANEL DISPLAY DEVICE HAVING REDUCED FRIT DELAMINATION AND METHOD OF FABRICATING THE SAME

CROSS-REFERENCE TO RELATED APPLICATION

This application claims the benefit of Korean Patent Application No. 10-2009-0066478, filed Jul. 21, 2009, in the Korean Intellectual Property Office, the disclosure of which is incorporated herein, by reference.

BACKGROUND

1. Field

The present teachings relate to a flat panel display device and a method of fabricating the same.

2. Description of the Related Art

Flat panel display devices are used as alternatives to cathode-ray tube display devices, due to their light weight and thin profile. Such flat panel display devices include liquid crystal display (LCD) devices and organic light emitting diode (OLED) display devices. Compared to the LCD devices, the OLED display devices have improved brightness, wider viewing angles, and thinner profiles, because they do not require a backlight.

OLED display devices are classified as being passive matrix or active matrix devices, according to the operating method thereof. The active matrix devices include a circuit having a thin film transistor (TFT). A TFT generally includes: a semiconductor layer having a source region, a drain region, and a channel region; a gate electrode; a source electrode; and a drain electrode. The semiconductor layer may be formed of polycrystalline silicon (poly-Si) or amorphous silicon (a-Si). However, since poly-Si has higher electron mobility than a-Si, poly-Si is used more frequently.

Generally, a flat panel display device includes: a first substrate having a display portion to display an image and a peripheral portion disposed outside the display portion; a second substrate facing the first substrate; and a sealant to attach the first substrate to the second substrate and to seal the display portion. A frit is generally used as the sealant, to prevent moisture and humidity from entering the display portion.

When the first substrate is attached to the second substrate using the frit, a signal interconnection is formed, so as to overlap with portions of the frit. The signal interconnection transmits various external signals to the display portion. Examples of the signals include an image signal for displaying a desired image, a test signal for a panel test and an aging signal for aging an organic layer. Since the adhesion between the frit and the signal interconnection is relatively weaker than the adhesion between the frit and an insulating layer, edges of the signal interconnection may become severely deformed. Thus, the surface that is attached to the frit is deformed, thereby becoming vulnerable to stress generated between the frit and the signal interconnection. As a result, the frit can be easily delaminated from the edges of the signal interconnection.

SUMMARY

Aspects of the present teachings provide a flat panel display device and a method of fabricating the same, which provide for reduced frit delamination, by dispersing stress generated between a signal interconnection and the frit, in regions where the signal interconnection overlaps the frit.

According to an aspect of the present teachings, a flat panel display device is provided that includes: a first substrate including a display portion to display an image and a peripheral portion disposed outside the display portion; a second substrate facing the first substrate; a frit disposed on the peripheral portion, to attach the first substrate to the second substrate; and a signal interconnection overlapping portions of the frit, to transmit external signals to the display portion. The overlapped edges of the signal interconnection are patterned into a variety of shapes.

According to another aspect of the present teachings, provided is a method of fabricating a flat panel display device that includes: forming a signal interconnection on a peripheral portion of a first substrate; patterning edges of the signal interconnection; and applying a frit to the peripheral portion of the first substrate, such that the frit overlaps the patterned edges; and attaching a second substrate to the first substrate, using the frit.

Additional aspects and/or advantages of the present teachings will be set forth in part in the description which follows and, in part, will be obvious from the description, or may be learned by practice of the present teachings.

BRIEF DESCRIPTION OF THE DRAWINGS

These and/or other aspects and advantages of the present teachings will become apparent and more readily appreciated from the following description of the exemplary embodiments, taken in conjunction with the accompanying drawings, of which.

DETAILED DESCRIPTION OF THE EXEMPLARY EMBODIMENTS

Figure 1:
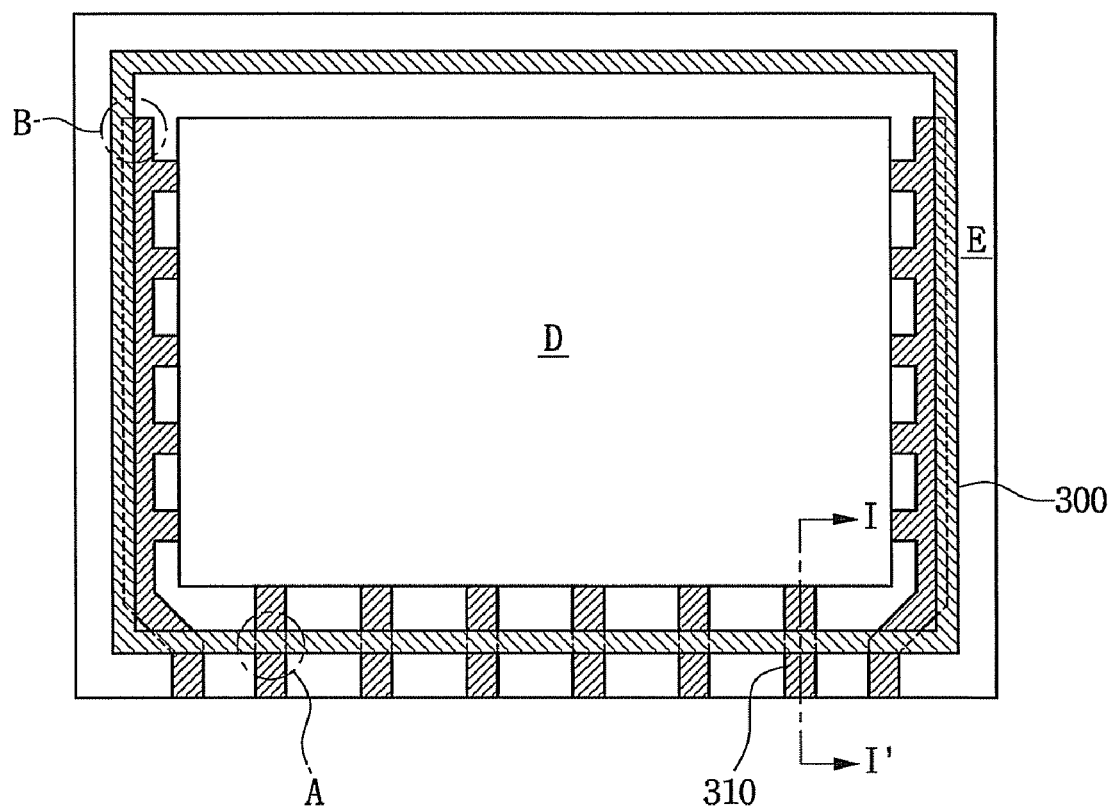
FIG. 1 is a plan view of a flat panel display device, according to an exemplary embodiment of the present teachings.

The present teachings will now be described in detail, with reference to the accompanying drawings, in which exemplary embodiments of the present teachings are shown. Like reference numerals refer to like elements throughout. When one part is referred to as being "connected to" another part, these parts may be "directly connected" with each other, or "electrically connected" to each, with a third device disposed therebetween. Similarly, when a first element is referred to as being "formed on" or "disposed on" a second element, the first element can be disposed directly on the second element, or one or more other elements may be disposed therebetween. When a first element is referred to as being formed or disposed "directly on" a second element, no other elements are disposed therebetween. In the drawings, thicknesses of layers and regions may be exaggerated for clarity.

Figure 2:
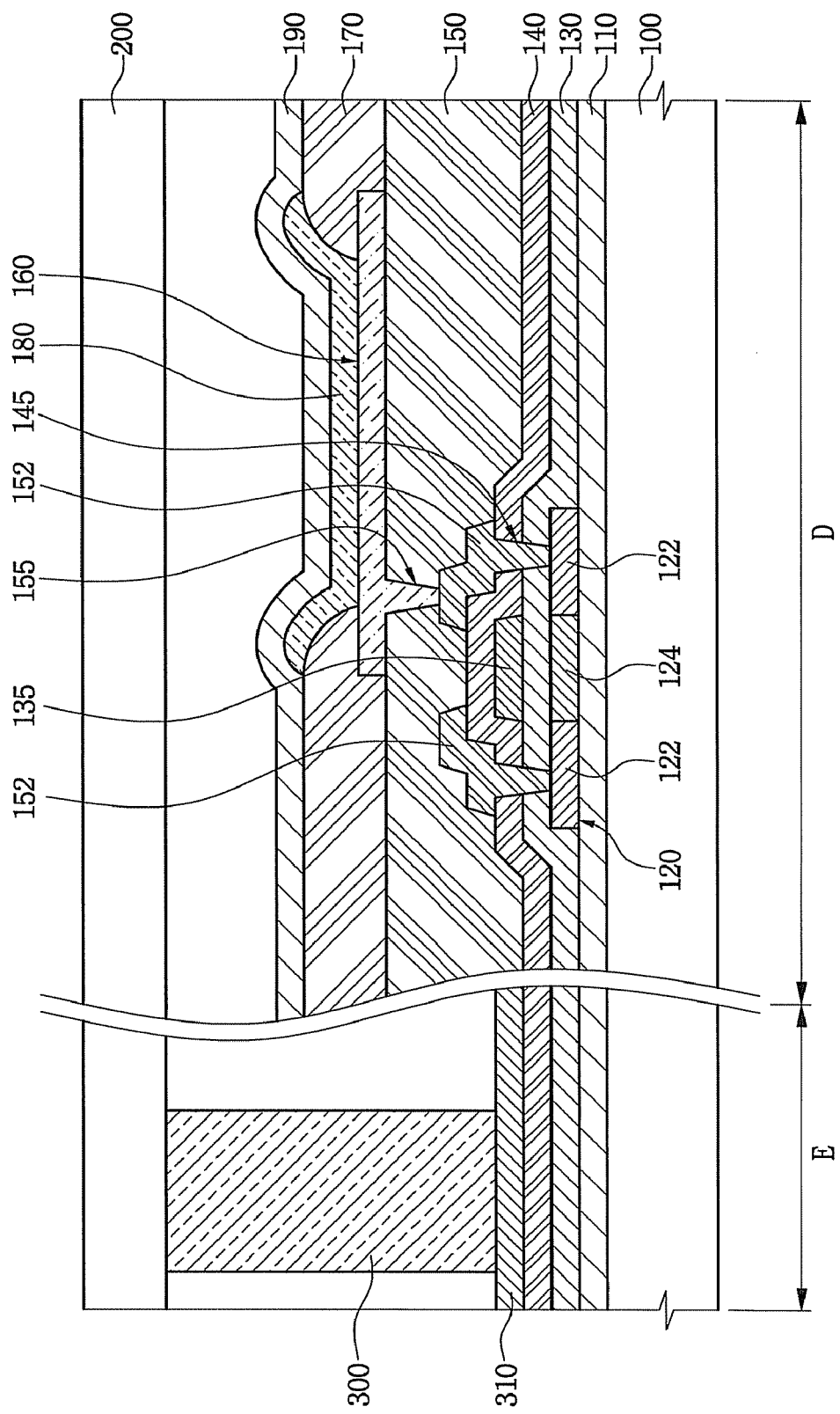
FIG. 2 is a cross-sectional view taken along line I-I' of FIG. 1.

FIG. 1 is a plan view of a flat panel display device, according to an exemplary embodiment of the present teachings, and FIG. 2 is a cross-sectional view taken along line I-I' of FIG. 1. Referring to FIGS. 1 and 2, the flat panel display device includes: a first substrate 100 having a display portion D to display a desired image, and a peripheral portion E disposed outside of the display portion D. A second substrate 200 faces the first substrate 100. A frit 300 is disposed on the peripheral portion E, to attach the first substrate 100 to the second substrate 200. A signal interconnection 310 partially overlaps the frit 300, to transmit signals, such as an image signal, a test signal, and/or an aging signal, to the display portion D, from an external source (not shown).

The signal interconnection 310 may be disposed between the peripheral portion E of the first substrate 100 and the frit 300, between the frit 300 and the second substrate 200, or between the frit 300, the first substrate 100 and the second substrate 200. The frit 300 is formed of at least one compound selected from the group consisting of MgO, CaO, BaO, $Li_2O$, $Na_2O$, $K_2O$, $B_2O_3$, $V_2O_5$, ZnO, $TeO_2$, $Al_2O_3$, $SiO_2$, PbO, SnO, $P_2O_5$, $Ru_2O$, $Rh_2O$, $Fe_2O_3$, CuO, $TiO_2$, $WO_3$, $Bi_2O_3$, $Sb_2O_3$, lead-borate glass, tin-phosphate glass, vanadate glass, and borosilicate glass.

The display portion D displays a desired image, in response to an image signal transmitted through the signal interconnection 310. As shown in FIG. 2, the display portion D includes an organic light emitting diode display device, including a thin film transistor having a semiconductor layer 120, a gate electrode 135, and source and drain electrodes 152, and an organic light emitting diode having a lower electrode 160, an upper electrode 190, and an organic layer 180 disposed between the lower electrode 160 and the upper electrode 190. The organic layer 180 includes at least one light emission layer (not shown). The display portion D is not limited to the above display device, and may also be liquid crystal or plasma display device.

Referring to FIGS. 1 and 2, in a method of forming the signal interconnection 310, according to an exemplary embodiment of the present teachings, a buffer layer 110 is formed on the first substrate 100. The first substrate 100 may be formed of glass, a synthetic resin or stainless steel. The buffer layer 110 prevents the diffusion of impurities from the first substrate 100, during a subsequent crystallization operation.

An a-Si layer (not shown) is deposited on the buffer layer 110, crystallized into a polycrystalline silicon (poly-Si) layer (not shown), and then patterned, to form the semiconductor layer 120. Here, the crystallization of the a-Si layer may be accomplished by solid phase crystallization, laser crystallization, super grain silicon (SGS) crystallization, metal induced crystallization, or metal induced lateral crystallization.

Subsequently, a gate insulating layer 130 is deposited on the first substrate 100 and the semiconductor layer 120. The gate insulating layer 130 may be formed of silicon oxide ($SiO_2$), silicon nitride ($SiN_x$), or a combination thereof.

A metal layer (not shown) is formed on the gate insulating layer 130. The metal layer may be a single layer of aluminum (Al) or an aluminum alloy such as aluminum-neodymium (Al—Nd), or may include an aluminum alloy layer deposited on a chromium (Cr) or molybdenum (Mo) alloy layer. Then, the metal layer is dry or wet etched to form the gate electrode 135 on a portion of the semiconductor layer 120. In particular, the gate electrode 135 may be formed on a channel region 124 of the semiconductor layer 120, which will be formed in a subsequent process.

Afterwards, a portion of the semiconductor layer 120 is doped with a conductive impurity, using the gate electrode 135 as a mask, to form source and drain regions 122 of the semiconductor layer 120. The channel region 124 is disposed between the source and drain regions 122. The doping process may be performed by forming a photoresist on the first substrate 100, before forming the gate electrode 135, or by doping a part of the channel region 124 with a low concentration impurity, to prevent a leakage current.

Subsequently, an interlayer insulating layer 140 is formed on the first substrate 100 and the gate electrode 135. The interlayer insulating layer 140 and the gate insulating layer 130 are etched to form contact holes 145 exposing the source and drain regions 122. Then, a conductive material, such as molybdenum-tungsten (MoW) or aluminum-neodymium (Al—Nd), is deposited on the interlayer insulating layer 140 and in the contact holes 145. The interlayer insulating layer 140 is patterned to form source and drain electrodes 152 that are respectively connected to the source and drain regions 122, through the contact holes 145, and the signal interconnection 310.

The source and drain electrodes 152 and the signal interconnection 310 may be simultaneously formed. The signal interconnection 310 may also be simultaneously formed with the gate electrode 135, a lower electrode 160, and/or an upper electrode 190. The source and drain electrodes 152, the gate electrode 135, the lower electrode 160, and the upper electrode 190, may be formed in a stacked structure.

Subsequently, a plurality of patterns (not shown) are formed in edges of the signal interconnection 310 overlapped by the frit 300, some of which are disposed in regions A and B of the peripheral portion E. Region A extends across the frit 300, and region B overlaps one edge of the frit 300. When the width of the signal interconnection 310 is smaller than the frit 300, a third region (not shown) parallel to and overlapping the frit 300 at both edges may be further included. The overlapped edges of the signal interconnection 310 may be separately patterned, or may be patterned simultaneously.

A planarization layer 150, including at least one of an organic insulating layer (such as an acryl layer) and an inorganic insulating layer (such as a silicon oxide layer) may be formed in the display portion D, on the source and drain electrodes 152, and then etched, to form a hole 155 exposing one of the source and drain electrodes 152. Subsequently, a conductive material is deposited on the planarization layer 150 and in the hole 155. The conductive material is then pattered to form the lower electrode 160, which is electrically connected to one of the source and drain electrodes 152, via the hole 155.

Then, a pixel defining layer 170 is formed on the lower electrode 160 and the planarization layer, in the display portion D. The pixel defining layer 170 partially exposes the lower electrode 160, to form an emission region. The pixel defining layer 170 may be formed of one selected from the group consisting of a polyimide, a benzocyclobutene resin, a phenol resin, and an acrylate.

The organic layer 180 is formed on/in the emission region defined by the pixel defining layer 170, that is, on the exposed surface of the lower electrode 160. The upper electrode 190 is then formed on the pixel defining layer 170 and the organic layer 180, across the entire display portion D. Thus, the display portion D of the first substrate 100 can display a desired image, in response to an external signal applied through the signal interconnection 310.

A second substrate 200 facing is attached to the first substrate 100 using the frit 300, which disposed at the peripheral portion E. The frit 300 is used to seal the display portion D. Consequently, the flat panel display device is completed.

In the exemplary embodiment of the present teachings, the signal interconnection 310 is in direct contact with the frit 300. However, an inorganic insulating layer (not shown) may be included between the signal interconnection 310 and the frit 300, in order to improve the adhesion strength between the signal interconnection 310 and the frit 300. The inorganic insulating layer may also prevent deterioration of the display device, due to the transmission of heat, generated during curing the frit 310, to the display portion D through the signal interconnection 310. The inorganic insulating layer may be formed of $SiO_2$, $SiN_x$, or a combination thereof.

Figure 3A:
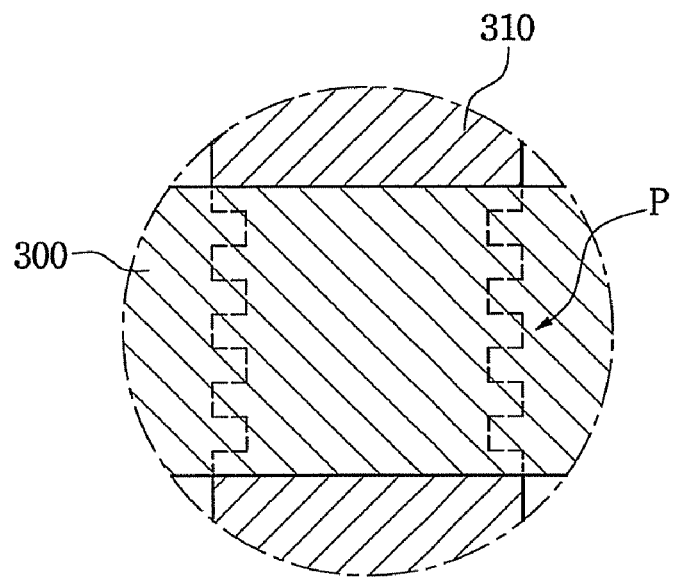
FIGS. 3A to 3G are enlarged cross-sectional views of region A of FIG. 1, which illustrate signal interconnections of the flat panel display device, according to exemplary embodiments of the present teachings.
Figure 3B:
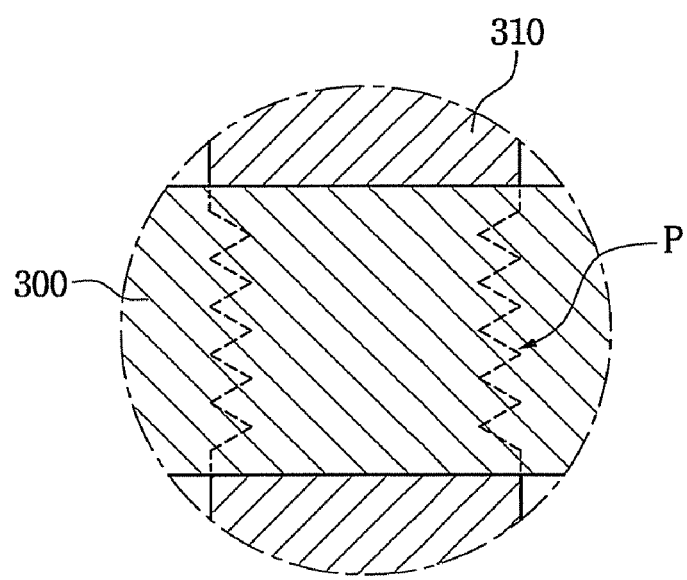

FIGS. 3A to 3G are enlarged cross-sectional views of region A of FIG. 1, which illustrate signal interconnections 310 of the flat panel display device. Referring to FIGS. 3A to 3G, in the first region A crossing the frit 300, the patterns P formed at the edge of the signal interconnection 310 may have recessed portions extending inward from the edge of the signal interconnection 310. As shown in FIGS. 3A and 3B, the cross-section of the recessed portion may be polygonal. In particular, the cross-section may be rectangular or triangular. In other words, the edges of the signal interconnection 310 may be zigzag-shaped or may include rectangular protrusions/cavities.

Figure 3C:
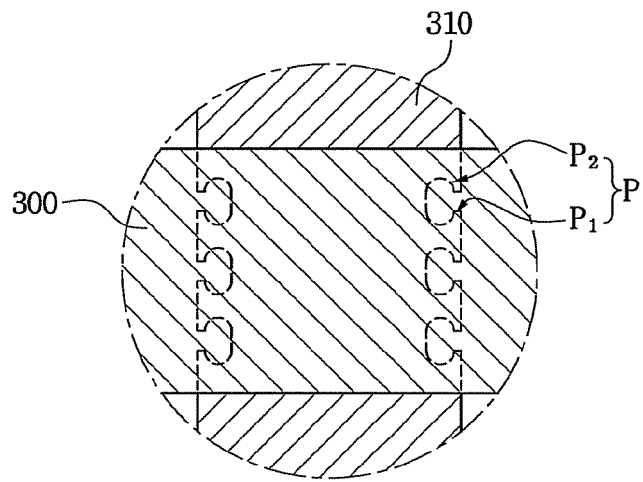
Figure 3D:
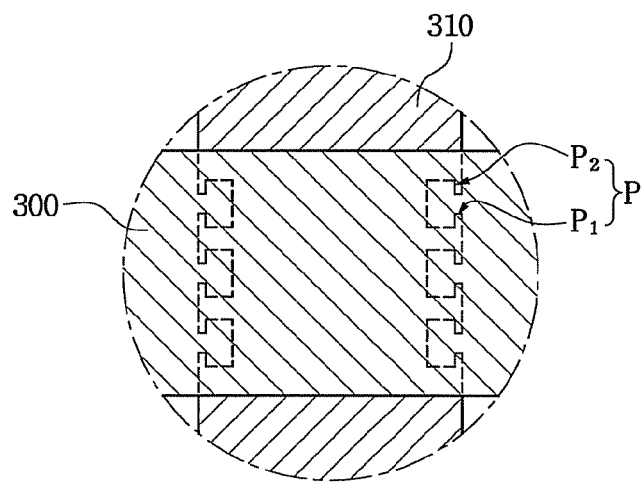
Figure 3E:
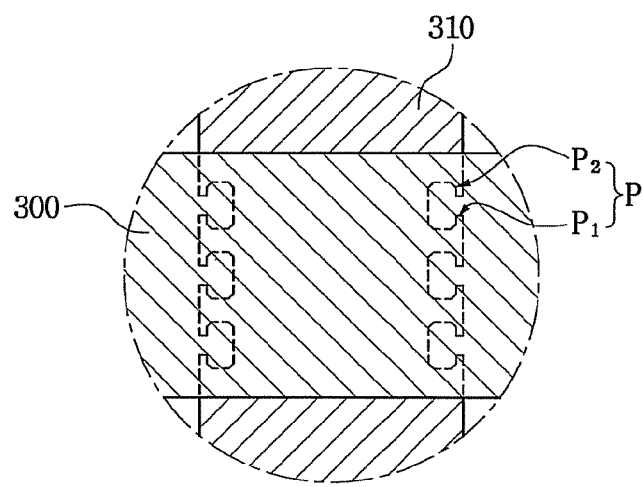
Figure 3F:
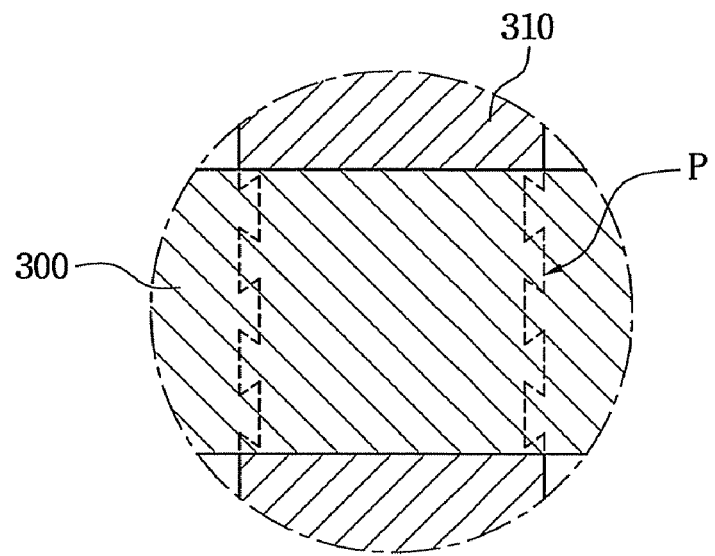
Figure 3G:
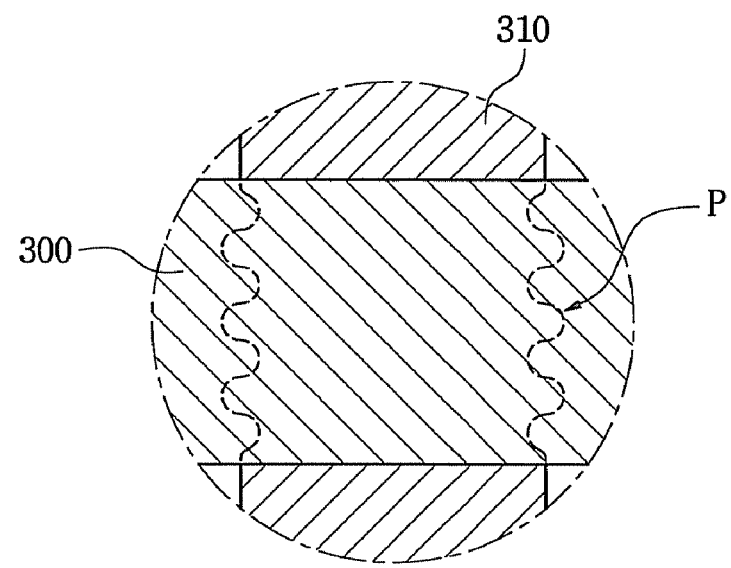

Alternatively, as shown in FIGS. 3C to 3E, each recessed portion may include a first part P1 extending inward a predetermined distance from the edge of the signal interconnection 310, and a second part P2 disposed further inside the signal interconnection 310, which extends from the first part P1. Here, the cross-section of the second part P2 may be circular or polygonal. As shown in FIG. 3F, the cross-section of the recessed portion may be trapezoidal, i.e. the edge of the signal interconnection 310 may include trapezoidal projections, with the longest side of each trapezoidal projection being disposed furthest from the center of the signal interconnection 310. As shown in FIG. 3G, the edges of the signal interconnection 310 may be serpentine.

Referring to FIGS. 3A to 3G, in the first region A, the patterns P are symmetrically formed at both edges of the signal interconnection 310. However, in the first region A, different-shaped patterns P may be formed in opposing overlapped edges of the signal interconnection 310, or the patterns P may be asymmetrically formed in the edges of the signal interconnection 310.

The patterns P formed in the second region B, in which one edge of the signal interconnection overlaps the frit 300, and the third region, in which the signal interconnection 310 is parallel to the frit 300, may have any of the shapes described above. Thus, the patterns P formed in the first region A may have the same shape as the patterns P formed in the second region B and the third region.

Table 1 shows comparison of delamination rates between the frit and the signal interconnection, according to whether or not the plurality of patterns are formed at the edge of the signal interconnection in the region, where the frit crosses the signal interconnection.

TABLE 1

| | Delamination Rate |
|---|---|
| Plurality of patterns are not formed | 2.75% |
| Plurality of patterns are formed | 0.39% |

A shown in Table 1, it can be seen that, in the regions where the frit crosses the signal interconnection, when the plurality of patterns are formed, the delamination rate is significantly decreased, as compared to when the plurality of patterns are not formed.

Consequently, in a flat panel display device and a method of fabricating the same, according to exemplary embodiments of the present teachings, it is possible to reduce delamination between a signal interconnection and a frit, by dispersing stress generated between the signal interconnection and the frit, by forming a plurality of patterns at edges of the signal interconnection overlapped by the frit.

Although a few exemplary embodiments of the present teachings have been shown and described, it would be appreciated by those skilled in the art that changes may be made in these exemplary embodiments, without departing from the principles and spirit of the present teachings, the scope of which is defined in the claims and their equivalents.

What is claimed is:

1. A flat panel display device, comprising:
    a first substrate including a display portion for displaying an image and a peripheral portion disposed outside the display portion;
    a second substrate facing the first substrate;
    a frit attaching the peripheral portion of the first substrate to the second substrate; and
    a signal interconnection disposed between the frit and one of the first and second substrates for transmitting a signal to the display portion from an external source;
    wherein edges of the signal interconnection that are covered by the frit have non-linear patterns formed therein.

2. The flat panel display device according to claim 1, wherein the patterns of opposing ones of the covered edges are different types of patterns.

3. The flat panel display device according to claim 1, wherein the patterns of opposing ones of the covered edges of the signal interconnection are symmetrical patterns.

4. The flat panel display device according to claim 1, wherein the patterns are serpentine.

5. The flat panel display device according to claim 1, wherein the patterns comprise projections and recesses.

6. The flat panel display device according to claim 5, wherein the projections are generally T-shaped, and the recesses are generally one of rectangular and ovoid.

7. The flat panel display device according to claim 5, wherein the recesses and projections are trapezoidal.

8. The flat panel display device according to claim 1, wherein the signal interconnection is disposed directly on at least one of the first and the second substrates.

9. The flat panel display device according to claim 1, wherein the display portion includes an organic light emitting diode comprising a first electrode, a second electrode, and at least one emission layer disposed between the first and second substrates.

10. The flat panel display device according to claim 9, wherein the signal interconnection is formed of a same material as one of the first electrode and the second electrode.

11. The flat panel display device according to claim 1, wherein the display portion includes a thin film transistor comprising a semiconductor layer, a gate electrode, a source electrode and a drain electrode.

12. The flat panel display device according to claim 11, wherein the signal interconnection is formed of a same material as one of the gate electrode and the source and drain electrodes.

13. The flat panel display device according to claim 1, further comprising an inorganic layer disposed between the frit and the signal interconnection.

14. The flat panel display device according to claim 1, wherein the frit is formed of at least one selected from a group consisting of MgO, CaO, BaO, $Li_2$, $Na_2O$, $K_2O$, $B_2O_3$, $V_2O_5$, ZnO, $TeO_2$, $Al_2O_3$, $SiO_2$, PbO, SnO, $P_2O_5$, $Ru_2O$, $Rh_2O$, $Fe_2O_3$, CuO, $TiO_2$, $WO_3$, $Bi_2O_3$, $Sb_2O_3$, lead-borate glass, tin-phosphate glass, vanadate glass, and borosilicate glass.

15. A method of fabricating a flat panel display device, comprising the steps of:
    preparing a first substrate including a display portion and a peripheral portion;

forming a signal interconnection on the peripheral portion for transmitting an external signal to the display portion;

forming non-linear patterns in edges of the signal interconnection; and attaching the first substrate to a second substrate using a frit disposed between the first and second substrates so that portions of the frit cover the patterned edges of the signal interconnection.

16. The method according to claim 15, wherein:

the step of forming the first substrate includes forming a thin film transistor in the display portion, said thin film transistor comprising a semiconductor layer, a gate electrode, a source electrode and a drain electrode; and the step of forming the signal interconnection is performed simultaneously with a forming of one of the gate electrode and the source and drain electrodes.

17. The method according to claim 15, wherein:

the step of forming the display portion includes forming an organic light emitting diode in the display portion, said organic light emitting diode comprising a first electrode, a second electrode and at least one emission layer; and the step of forming the signal interconnection is performed simultaneously with a forming of one of the first electrode and the second electrode.

18. The method according to claim 16, wherein the signal interconnection is disposed directly on at least one of the first and second substrates.

19. The method according to claim 15, wherein the step of forming the patterns in the edges of the signal interconnection comprises forming at least two different types of patterns.

20. The method according to claim 15, wherein the step of forming the patterns in the edges of the signal interconnection comprises forming symmetrical patterns in opposing ones of the patterned edges.

* * * * *